(12) United States Patent
Chew et al.

(10) Patent No.: US 10,763,133 B2
(45) Date of Patent: Sep. 1, 2020

(54) SEMICONDUCTOR STRUCTURE AND SEMICONDUCTOR PACKAGE DEVICE USING THE SAME

(71) Applicant: ADVANPACK SOLUTIONS PTE LTD., Singapore (SG)

(72) Inventors: Jimmy Hwee-Seng Chew, Singapore (SG); Kian-Hock Lim, Singapore (SG); Oviso Dominador Jr. Fortaleza, Singapore (SG); Shoa-Siong Lim, Singapore (SG)

(73) Assignee: ADVANPACK SOLUTIONS PTE LTD., Singapore (SG)

( * ) Notice: Subject to any disclaimer, the term of this patent is extended or adjusted under 35 U.S.C. 154(b) by 51 days.

(21) Appl. No.: 16/136,042

(22) Filed: Sep. 19, 2018

(65) Prior Publication Data

US 2019/0035643 A1    Jan. 31, 2019

Related U.S. Application Data

(62) Division of application No. 13/556,022, filed on Jul. 23, 2012, now Pat. No. 10,109,503.

(Continued)

(51) Int. Cl.
*H01L 21/56* (2006.01)
*H01L 21/683* (2006.01)
(Continued)

(52) U.S. Cl.
CPC ........ *H01L 21/568* (2013.01); *H01L 21/4846* (2013.01); *H01L 21/6835* (2013.01); *H01L 23/49861* (2013.01); *H01L 21/486* (2013.01); *H01L 23/3107* (2013.01); *H01L 24/32* (2013.01); *H01L 24/48* (2013.01); *H01L 24/73* (2013.01); *H01L 2221/68345* (2013.01); *H01L 2221/68381* (2013.01);
(Continued)

(58) Field of Classification Search
CPC ..................................................... H01L 21/568
USPC .......................................................... 257/762
See application file for complete search history.

(56) References Cited

U.S. PATENT DOCUMENTS 5,780,315 A * 7/1998 Chao ....................... H01L 22/26
438/8
5,985,765 A    11/1999 Hsiao et al.
(Continued)

FOREIGN PATENT DOCUMENTS

| CN | 100437987 C | 11/2008 |
|---|---|---|
| CN | 102132404 A | 7/2011 |
| JP | 2008-153622 A | 7/2008 |

OTHER PUBLICATIONS

Chinese Office Action dated Aug. 1, 2014.
(Continued)

*Primary Examiner* — Ajay Arora
(74) *Attorney, Agent, or Firm* — Rabin & Berdo, P.C.

(57) ABSTRACT

A semiconductor structure for manufacturing a semiconductor package device is provided. The semiconductor structure includes a carrier and a dielectric layer. The carrier has a first surface and a second surface opposite to the first surface. The carrier includes an inner core layer and an exterior clad layer, and the inner core layer is covered by the exterior clad layer. The dielectric layer is formed on the first surface of the carrier. The carrier supports the dielectric layer.

10 Claims, 7 Drawing Sheets

Related U.S. Application Data (60) Provisional application No. 61/510,494, filed on Jul. 22, 2011.

(51) Int. Cl.
  *H01L 23/498* (2006.01)
  *H01L 21/48* (2006.01)
  *H01L 23/31* (2006.01)
  *H01L 23/00* (2006.01)

(52) U.S. Cl.
  CPC .............. *H01L 2224/32225* (2013.01); *H01L 2224/48091* (2013.01); *H01L 2224/48227* (2013.01); *H01L 2224/73265* (2013.01); *H01L 2224/85447* (2013.01); *H01L 2924/00014* (2013.01); *H01L 2924/181* (2013.01); *H01L 2924/207* (2013.01)

(56) References Cited

U.S. PATENT DOCUMENTS

| | | | |
|---|---|---|---|
| 7,365,441 | B2 | 4/2008 | Ikenaga et al. |
| 7,474,538 | B2 | 1/2009 | Kikuchi et al. |
| 8,310,060 | B1 | 11/2012 | Nondhasittichai et al. |
| 8,865,525 | B2 | 10/2014 | Lin et al. |
| 8,866,301 | B2 | 10/2014 | Lin et al. |
| 2001/0006851 | A1 | 7/2001 | Choi et al. |
| 2002/0037647 | A1 | 3/2002 | Hwang et al. |
| 2002/0168542 | A1 | 11/2002 | Izbicki et al. |
| 2003/0057568 | A1 | 3/2003 | Miyazaki |
| 2003/0064671 | A1 | 4/2003 | Pasqualoni et al. |
| 2003/0203171 | A1 | 10/2003 | Higashitani |
| 2003/0232205 | A1 | 12/2003 | Tsukaguchi et al. |
| 2004/0026361 | A1 | 2/2004 | Namba et al. |
| 2005/0088833 | A1 | 4/2005 | Kikuchi et al. |
| 2006/0189141 | A1 | 8/2006 | Mahlkow et al. |
| 2006/0292851 | A1 | 12/2006 | Lin et al. |
| 2007/0120229 | A1 | 5/2007 | Sakayori et al. |
| 2007/0281471 | A1 | 12/2007 | Hurwitz et al. |
| 2009/0046441 | A1 | 2/2009 | Funaya et al. |
| 2009/0102043 | A1 | 4/2009 | Jimmy et al. |
| 2009/0209064 | A1 | 8/2009 | Nonahasitthichai et al. |
| 2009/0291530 | A1 | 11/2009 | Jimmy et al. |
| 2010/0270668 | A1 | 10/2010 | Marcoux |
| 2011/0210442 | A1 | 9/2011 | Lim et al. |
| 2012/0153463 | A1 | 6/2012 | Maeda |
| 2012/0153466 | A1 | 6/2012 | Chew et al. |
| 2013/0020710 | A1 | 1/2013 | Chew et al. |
| 2013/0175707 | A1 | 7/2013 | Chew et al. |

OTHER PUBLICATIONS

Chinese Office Action dated Jul. 20, 2011.
USPTO Office Action dated Jun. 26, 2015 in U.S. Appl. No. 13/689,207.
USPTO-provided Translation of Chinese Office Action dated Jan. 21, 2015.
Chinese Office Action dated Aug. 10, 2015.
USPTO Office Action dated Dec. 10, 2015 of U.S. Appl. No. 13/689,207.
U.S. Office Action dated Sep. 9, 2016.

\* cited by examiner

SEMICONDUCTOR STRUCTURE AND SEMICONDUCTOR PACKAGE DEVICE USING THE SAME

This application is a divisional application of U.S. application Ser. No. 13/556,022, filed on Jul. 23, 2012, which claims the benefit of U.S. provisional application Ser. No. 61/510,494, filed on Jul. 22, 2011. The entire contents of the related applications are incorporated herein by reference.

BACKGROUND OF THE INVENTION

Field of the Invention

The invention relates in general to a semiconductor structure and a manufacturing method of the same, and more particularly to a semiconductor structure for manufacturing a semiconductor package device and a manufacturing method of the same.

Description of the Related Art

Conventionally, a semiconductor package device includes such as a substrate, conductive wires, an epoxy resin encapsulation layer, and a chip. The material of the substrate is such as copper, for carrying the chip. The chip is electrically connected to the conductive wires, and the epoxy resin encapsulation layer covers the conductive wires and the chip.

However, when the whole substrate is formed of copper, the cost is relatively high, and warpage occurs easily. Furthermore, the adhesion between the epoxy resin encapsulation layer and the conductive wires is poor, leading to the leakage of chemical solutions which undercuts the conductive wires in subsequent manufacturing procedures. Therefore, it is necessary to develop solutions in order to solve the above-mentioned problems.

SUMMARY OF THE INVENTION

The invention is directed to a semiconductor structure and a manufacturing method of the same. In the semiconductor structure, a carrier comprises an exterior clad layer and an inner core layer covered by the exterior clad layer, and hence a better etching stop is provided in subsequent processes. Furthermore, a trace wiring layer is embedded within a dielectric layer, which can prevent the trace wiring layer from being damaged by chemical solutions in subsequent manufacturing procedures.

According to an embodiment of the present invention, a semiconductor structure for manufacturing a semiconductor package device is provided. The semiconductor structure includes a carrier and a dielectric layer. The carrier has a first surface and a second surface opposite to the first surface. The carrier includes an inner core layer and an exterior clad layer, and the inner core layer is covered by the exterior clad layer. The dielectric layer is formed on the first surface of the carrier. The carrier supports the dielectric layer.

The disclosure will become apparent from the following detailed description of the preferred but non-limiting embodiments. The following description is made with reference to the accompanying drawings.

DETAILED DESCRIPTION OF THE INVENTION

Figure 1A:
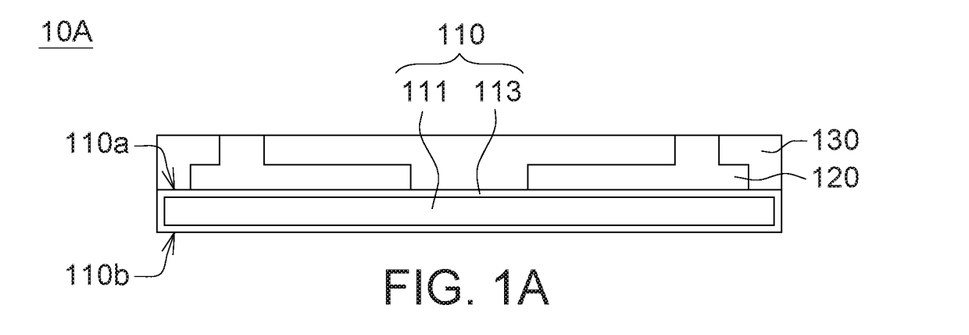
FIG. 1A shows a cross-sectional view of a semiconductor structure according to an embodiment of the present invention.

Referring to FIG. 1A, FIG. 1A shows a cross-sectional view of a semiconductor structure according to an embodiment of the present invention. The semiconductor structure 10A includes a carrier 110 and a trace wiring layer 120. The carrier 110 has a first surface 110a and a second surface 110b opposite to the first surface 110a. The carrier 110 comprises an inner core layer 111 and an exterior clad layer 113, and the inner core layer 111 is covered by the exterior clad layer 113.

In an embodiment, the thickness of the inner core layer 111 is about 200 μm, and the thickness of the exterior layer 113 is about 5~20 μm. In the embodiment, a ratio of the thickness of the inner core layer 111 to the thickness of the exterior clad layer 113 is such as greater than 10.

In the embodiment, the inner core layer 111 comprises a first metal, and the first metal is such as steel, an alloy comprising at least two of carbon (C), manganese (Mg), phosphorus (P), sulfur (S), chromium (Cr), and nickel (Ni), or a steel alloy. In an embodiment, the inner core layer 111 is such as an alloy of the following composition: at least 97% of iron, less than or equal to 0.12% of carbon, less than or equal to 0.5% of manganese, less than or equal to 0.05% of phosphorus, less than or equal to 0.05% of sulfur, less than or equal to 0.2% of chromium, and less than or equal to 0.2% of nickel, wherein the percentages of carbon and nickel can be as low as 0%. In another embodiment, the inner core layer 111 comprises such as a conductive metal material.

In the embodiment, the exterior clad layer 113 comprises a second metal, and the material of the second metal is such as copper. The materials of the first metal and the second metal are different. For example, in the step of removing the carrier 110 in subsequent semiconductor processes, the materials of the first metal and the second metal being different can provide a better etching stop. Furthermore, when the material of the exterior clad layer 113 is copper, the whole carrier 110 can be treated as an intact copper layer for further operations and applications, and hence the whole manufacturing cost can be reduced. In another embodiment, the material of the exterior clad layer 113 comprises such as a conductive metal material.

The coefficient of thermal expansion (CTE) and the modulus of the carrier 110 depend on the CTE and the modulus of the inner core layer 111. In the embodiment, the first metal of the inner core layer has a CTE between 10~15 ppm/° C., and such CTE is closed to the CTE of the encapsulating material used to cover a semiconductor device. Therefore, the warpage of the semiconductor package device made from the carrier 110 is reduced, which allows an increase of the area of the carrier 110. Under such circumstance, a larger number of semiconductor package devices can be formed on the carrier 110. In the embodiment, the first metal of the inner core layer 111 has a modulus between 150~250 GPa. The rigid property of the carrier 110 is advantageous for the operations in subsequent manufacturing processes.

As shown in FIG. 1A, the semiconductor structure 10A can comprise of a dielectric layer 130 formed on the carrier 110. In the embodiment, the dielectric layer 130 is formed on the first surface 110a of the carrier 110. In the embodiment, the dielectric layer 130 is, for example, a resin material having a CTE between 10~15 ppm/° C. A difference between the CTE of the carrier 110 and the CTE of the dielectric layer 130 is less than 3 ppm/° C. In an embodiment, the material of the dielectric layer 130 is such as an organic resin material. In another embodiment, the material of the dielectric layer 130 comprises such as epoxy resin or silica fillers.

As shown in FIG. 1A, a trace wiring layer 120 is within the dielectric layer 130. The trace wiring layer 120 embedded within the dielectric layer 130 can prevent the trace wiring layer 120 from being damaged by chemical solutions in the subsequent etching processes.

In the embodiment, the dielectric layer 130 has a first surface adjacent to the carrier 110 and a second surface opposite to the first surface. The trace wiring layer 120 is embedded between the first surface and the second surface of the dielectric layer 130, and the trace wiring layer 120 connects the first surface of the dielectric layer 130 to the second surface of the dielectric layer 130.

In the embodiment, part of the trace wiring layer 120 is exposed from the dielectric layer 130. In the embodiment, the material of the exterior clad layer 113 is such as copper. The material of the trace wiring layer 120 can be same with the material of the exterior clad layer 113.

Figure 1B:
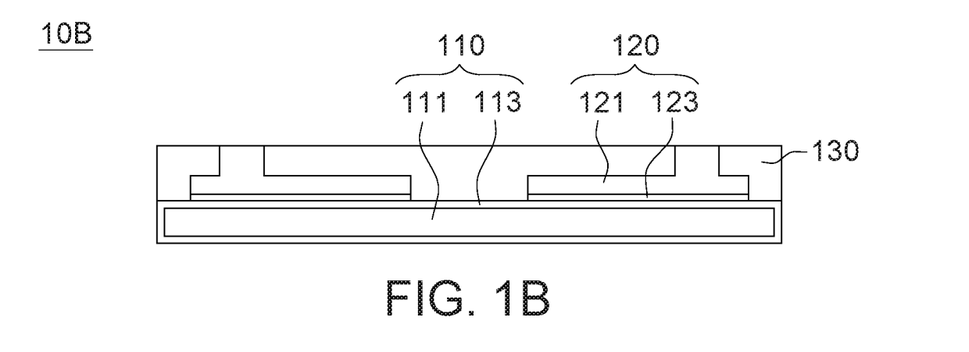
FIG. 1B shows a cross-sectional view of a semiconductor structure according to another embodiment of the present invention.

Referring to FIG. 1B, FIG. 1B shows a cross-sectional view of a semiconductor structure according to another embodiment of the present invention. The difference between the present embodiment and the embodiment as shown in FIG. 1A is that, in the semiconductor structure 10B, the trace wiring layer 120 comprises a conductive layer 121 and a barrier layer 123. The conductive layer 121 is formed on the carrier 110, and the barrier layer 123 is formed between the carrier 110 and the conductive layer 121.

In the embodiment, the material of the conductive layer 121 is such as copper, and the material of the barrier layer 123 is such as nickel, gold, or tin. In the embodiment, the thickness of the conductive layer 121 is such as about 15 μm, and the thickness of the barrier layer 123 is such as about 5 μm.

Figure 1C:
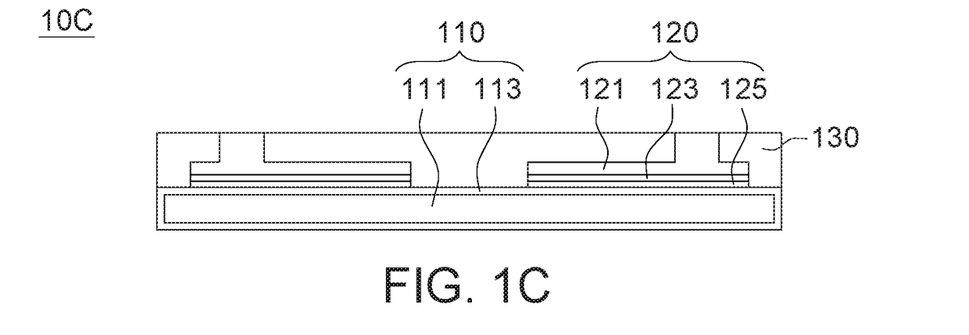
FIG. 1C shows a cross-sectional view of a semiconductor structure according to a further embodiment of the present invention.

Referring to FIG. 1C, FIG. 1C shows a cross-sectional view of a semiconductor structure according to a further embodiment of the present invention. The difference between the present embodiment and the embodiment as shown in FIG. 1B is that, in the semiconductor structure 10C, the trace wiring layer 120 further comprises a protective layer 125 formed on the carrier 110 and disposed between the carrier 110 and the barrier layer 123.

In the embodiment, the material of the protective layer 125 is such as copper. For example, the material of the protective layer 125 is the same with the material of the exterior clad layer 113. In an embodiment, the thickness of the protective layer 125 is such as about 5 μm.

Figure 2A:
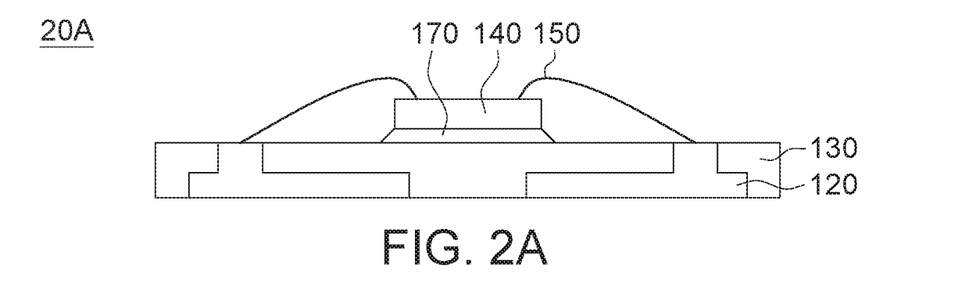
FIG. 2A shows a cross-sectional view of a semiconductor package device according to an embodiment of the present invention.

Referring to FIG. 2A, FIG. 2A shows a cross-sectional view of a semiconductor package device according to an embodiment of the present invention. The semiconductor package device 20A comprises a trace wiring layer 120, a dielectric layer 130, and a semiconductor device 140. The trace wiring layer 120 is embedded within the dielectric layer 130, and the semiconductor device 140 is disposed on the dielectric layer 130. In the embodiment, the semiconductor device 140 is electrically connected to the trace wiring layer 120.

In the embodiment, the trace wiring layer 120 is embedded within the dielectric layer 130, and hence the damage of the trace wiring layer 120 by chemical solutions in the subsequent etching processes can be prevented.

As shown in FIG. 2A, the semiconductor package device 20A can comprise a connection element 150, and the connection element 150 electrically connects the semiconductor device 140 to the trace wiring layer 120.

Figure 2B:
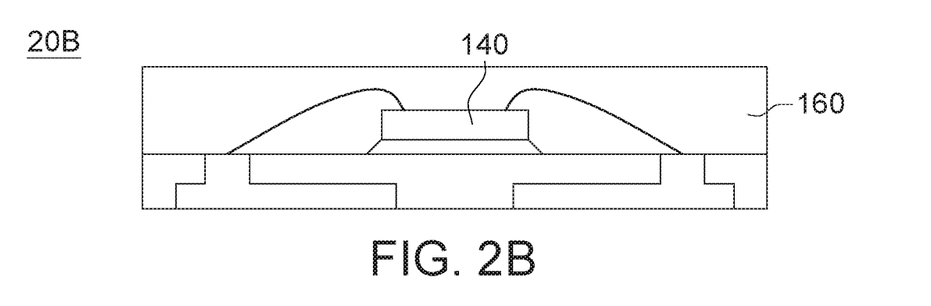
FIG. 2B shows a cross-sectional view of a semiconductor package device according to another embodiment of the present invention.

Referring to FIG. 2B, FIG. 2B shows a cross-sectional view of a semiconductor package device according to another embodiment of the present invention. The difference between the present embodiment and the embodiment as shown in FIG. 2A is that, the semiconductor package device 20B can further comprise an encapsulation layer 160 covering the semiconductor device 140.

Figure 2C:
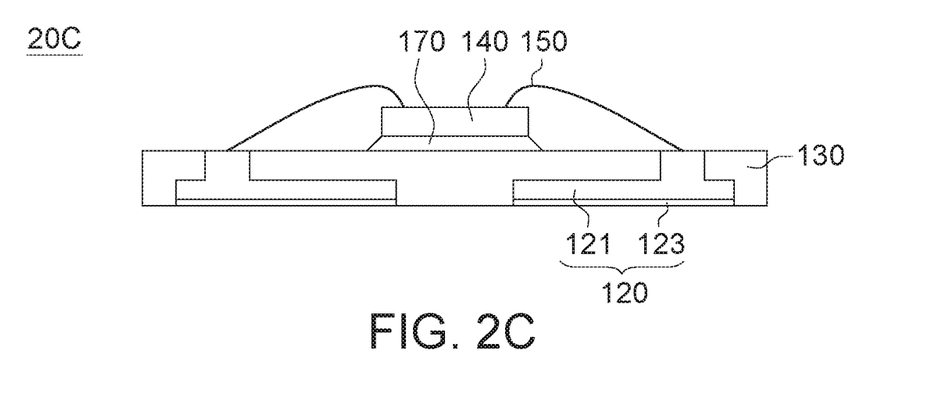
FIG. 2C shows a cross-sectional view of a semiconductor package device according to a further embodiment of the present invention.

Referring to FIG. 2C, FIG. 2C shows a cross-sectional view of a semiconductor package device according to a further embodiment of the present invention. The difference between the present embodiment and the embodiment as shown in FIG. 2A is that, in the semiconductor package device 20C, the trace wiring layer 120 comprises a conductive layer 121 and a barrier layer 123. The materials, thicknesses, and arrangements of the conductive layer 121 and the barrier layer 123 are as aforementioned. Part of the barrier layer 123 is exposed from the dielectric layer 130, and hence the semiconductor package device 20C can be easily welded to other external components, such as substrates.

Please refer to FIG. 3A~FIG. 3G. FIG. 3A~FIG. 3G illustrate a process for manufacturing a semiconductor package device according to an embodiment of the present invention.

Figure 3A:
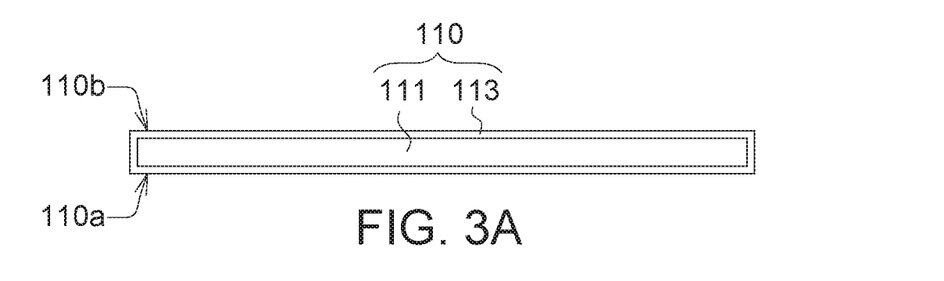
FIG. 3A~FIG. 3G illustrate a process for manufacturing a semiconductor package device according to an embodiment of the present invention.

Referring to FIG. 3A, a carrier 110 is provided. The carrier 110 has a first surface 110a and a second surface 110b opposite to the first surface 110a. The carrier 110 comprises an inner core layer 111 and an exterior clad layer 113, and the inner core layer 111 is covered by the exterior clad layer 113. The materials of the exterior clad layer 113 and the inner core layer 111 are as aforementioned.

In the embodiment, the manufacturing method of the carrier 110 includes such as the following steps: providing the inner core layer 111, degreasing a surface of the inner core layer 111, buffing the surface of the inner core layer 111, and forming the exterior clad layer 113.

In the embodiment, the surface of the inner core layer 111 is degreased by, such as, removing remaining or unnecessary chemicals and particles and cleaning the surface of the inner core layer 111, such that the adhesion of the inner core layer 111 and the exterior clad layer 113 can be increased. In the embodiment, the surface of the inner core layer 113 is buffed by, for example, removing the defects on the surface, such as scratches or pits, to form a smooth surface. Next, the exterior clad layer 113 is formed by such as electrolytic plating or electroless plating. In the embodiment, before the exterior clad layer 113 is formed, a seed plating layer can be formed first to enhance the plating growth of the exterior clad layer 113.

Figure 3B:
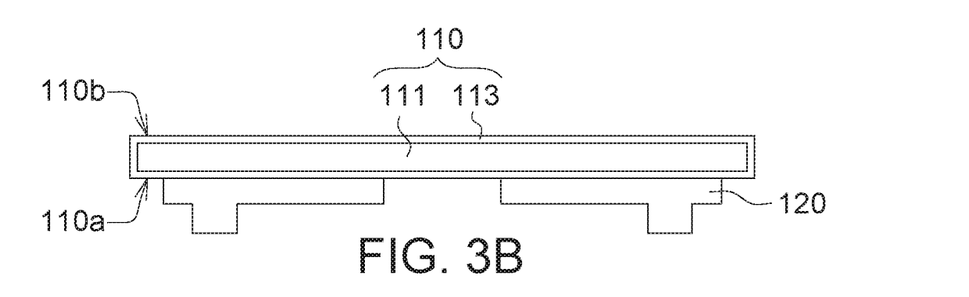

Referring to FIG. 3B, a trace wiring layer 120 is formed on the first surface 110a of the carrier 110.

In an embodiment, the step of forming the trace wiring layer 120 includes, such as: forming a barrier layer 123 on the carrier 112 and forming a conductive layer 121 on the barrier layer 123, as shown in FIG. 1B. In another embodiment, the step of forming the trace wiring layer 120 includes, such as: forming a protective layer 125 on the carrier 110, forming a barrier layer 123 on the protective layer 125, and forming a conductive layer 121 on the barrier 123, as shown in FIG. 1C.

In the embodiment, the trace wiring layer 120 is formed on the carrier 110 by such as a patterned electrolytic plating process. In the embodiment, the trace wiring layer 120 is formed on the carrier 110 by such as a full additive process, a semi-additive process, or a full subtractive process, and the above-mentioned processes can be carried out repeatedly to form a plurality of trace wiring layers 120 or a trace wiring layer 120 having a multi-layered structure.

Figure 3C:
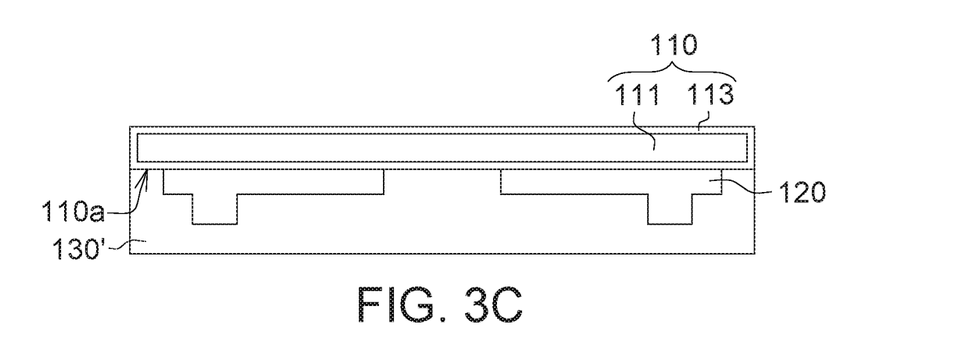

Referring to FIG. 3C, a layer of insulating material 130' is formed on the carrier 110 covering the trace wiring layer 120. In the embodiment, the layer of insulating material 130' is formed on the first surface 110a of the carrier 110 fully covering the trace wiring layer 120. In an embodiment, the layer of insulating material 130' is formed on the carrier 110 by such as a transfer or compression molding process. The transfer or compression molding process is performed under high temperature and high pressure, such that a good adhesion between the dielectric layer 130 and trace wiring layer is achieved, and the trace wiring layer will not be damaged in the subsequent etching processes. In another embodiment, the layer of insulating material 130' is formed on the carrier 110 by such as a lamination process or a spin-coating process.

Figure 3D:
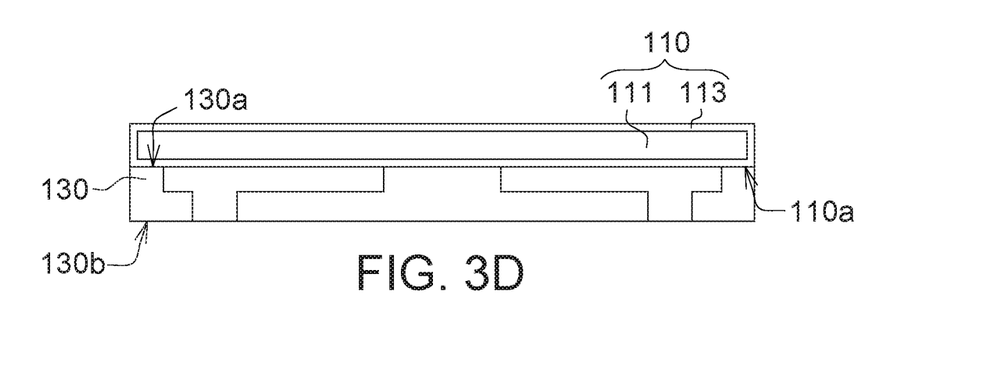

Referring to FIG. 3D, the layer of insulating material 130' is thinned to form the dielectric layer 130 exposing the trace wiring layer 120. The dielectric layer 130 has a first surface 130a and a second surface 130b opposite to the first surface 130a. The first surface 130a of the dielectric layer 130 is adjacent to the first surface 110a of the carrier 110. In the embodiment, for example, the layer of insulating material 130' is grinded from the side opposite to the first surface 110a of the carrier 110 to form the dielectric layer 130, and a part of the trace wiring layer 120 is exposed from the second surface 130b of the dielectric layer 130.

Figure 3E:
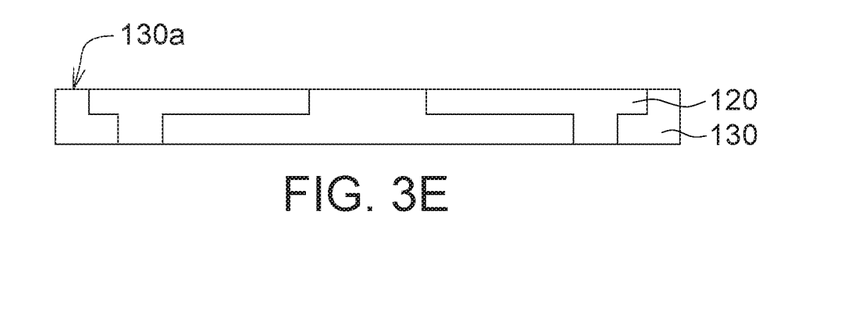

Referring to FIG. 3E, the carrier 110 is removed. In the embodiment, the carrier 110 is removed by such as an etching process. Meanwhile, another part of the trace wiring layer 120 is exposed from the first surface 130a of the dielectric layer 130. Thus, in the as-formed semiconductor structure, the trace wiring layer 120 is fully embedded within the dielectric layer 130.

Figure 3F:
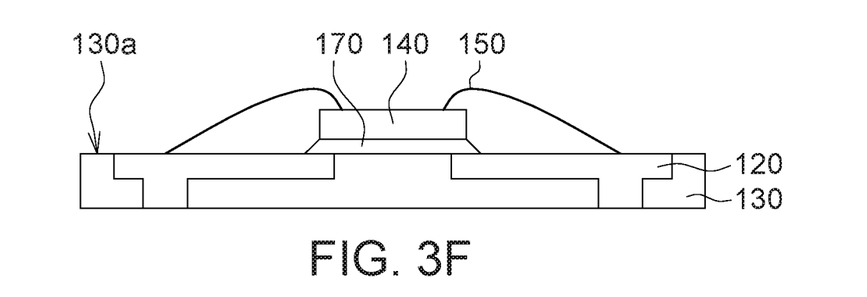

Referring to FIG. 3F, a semiconductor device 140 is disposed on the dielectric layer 130. In the embodiment, the semiconductor device 140 is disposed on the first surface 130a of the dielectric layer 130. As shown in FIG. 3F, a connection element 150 and an adhesion layer 170 can be formed. The connection element 150 electrically connects the semiconductor device 140 to the trace wiring layer 120, and the semiconductor device 140 is disposed on the dielectric layer 130 through the adhesion layer 170.

Figure 3G:
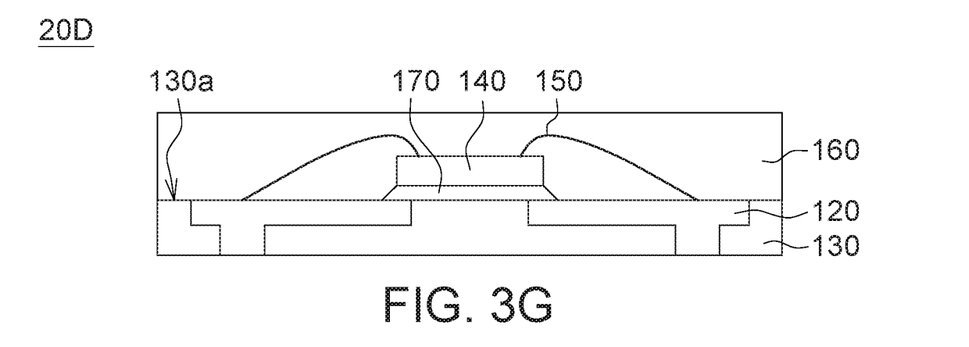

Referring to FIG. 3G, an encapsulation layer 160 is formed. The encapsulation layer 160 covers the semiconductor device 140. As shown in FIG. 3G, the encapsulation layer 160 covers the trace wiring layer 120, the semiconductor device 140, the connection element 150, the adhesion layer 170, and part of the first surface 130a of the dielectric layer 130. As such, the semiconductor package device 20D as shown in FIG. 3G is formed.

Figure 4A:
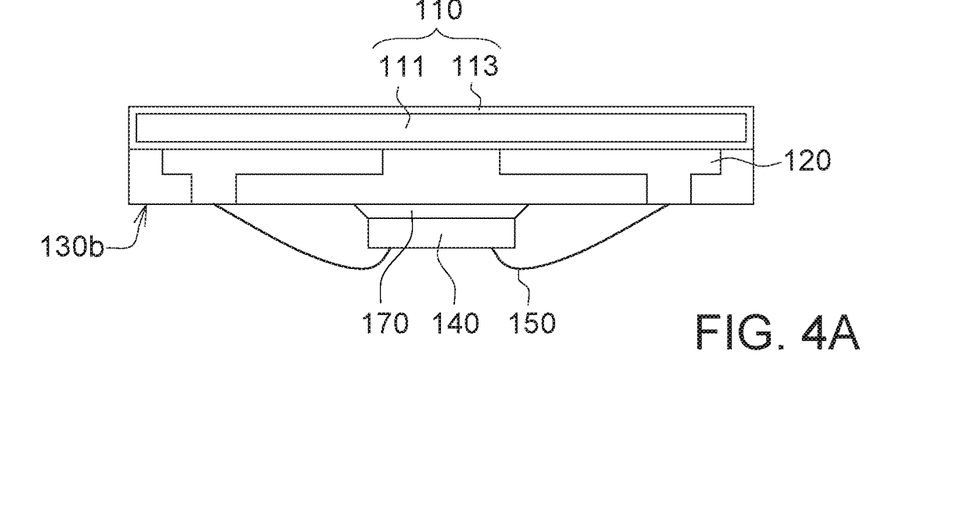
FIG. 4A~FIG. 4C illustrate a process for manufacturing a semiconductor package device according to another embodiment of the present invention.
Figure 4B:
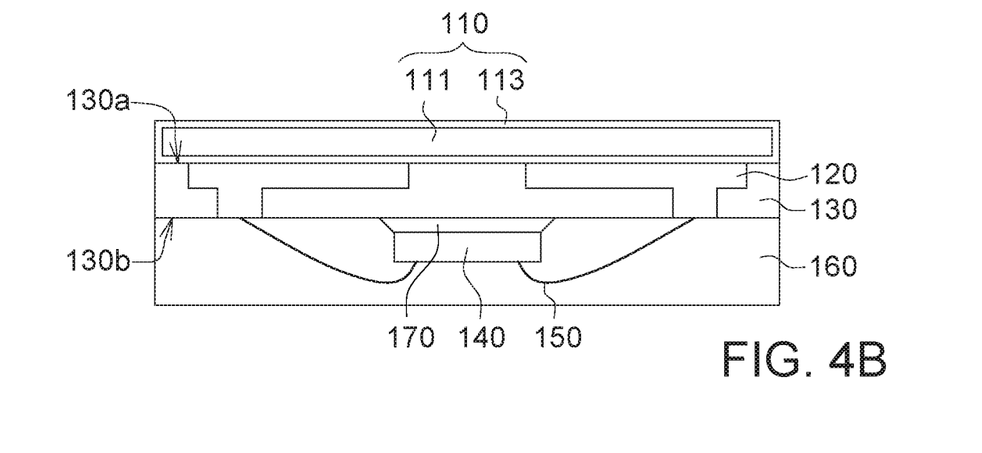
Figure 4C:
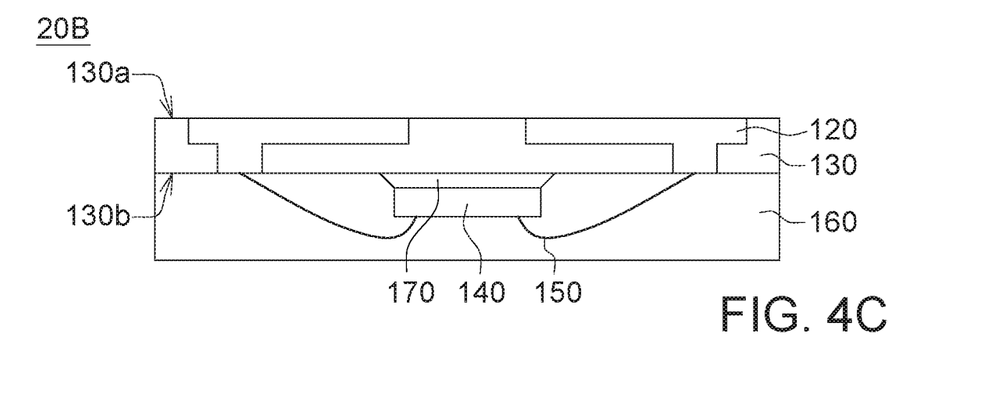

Please refer to FIGS. 3A~3D and FIGS. 4A~4C. FIG. 4A~FIG. 4C illustrate a process for manufacturing a semiconductor package device according to another embodiment of the present invention. The elements in this and previous embodiments sharing the same labeling are the same elements, and the description of which are as aforementioned.

First, as shown in FIGS. 3A~3D, a carrier 110 is provided, a trace wiring layer 120 is formed on the first surface 110a of the carrier 110, a layer of insulating material 130' is formed on the carrier 110 covering the trace wiring layer 120, and the layer of insulating material 130' is thinned to form a dielectric layer 130 exposing the trace wiring layer 120.

Referring to FIG. 4A, a semiconductor device 140 is disposed on the dielectric layer 130. In the embodiment, the semiconductor device 140 is disposed on the second surface 130b of the dielectric layer 130. As shown in FIG. 4A, a connection element 150 and an adhesion layer 170 can be formed. The connection element 150 electrically connects the semiconductor device 140 to the trace wiring layer 120, and the semiconductor device is disposed on the dielectric layer 130 through the adhesion layer 170.

Referring to FIG. 4B, an encapsulation layer 160 is formed. The encapsulation layer 160 covers the semiconductor device 140. As shown in FIG. 4B, the encapsulation layer 160 covers the trace wiring layer 120, the semiconductor device 140, the connection element 150, the adhesion layer 170, and part of the second surface 130b of the dielectric layer 130.

Referring to FIG. 4C, the carrier 110 is removed. In the embodiment, the carrier 110 is removed by such as an etching process. Meanwhile, a part of the trace wiring layer 120 is exposed from the first surface 130a of the dielectric layer 130. As such, the semiconductor package device 20B as shown in FIG. 4C (FIG. 2B) is formed.

Please refer to FIGS. 5A~5D. FIG. 5A~FIG. 5D illustrate a process for removing a carrier according to an embodiment of the present invention. The elements in this and previous embodiments sharing the same labeling are the same elements, and the description of which are as aforementioned.

Figure 5A:
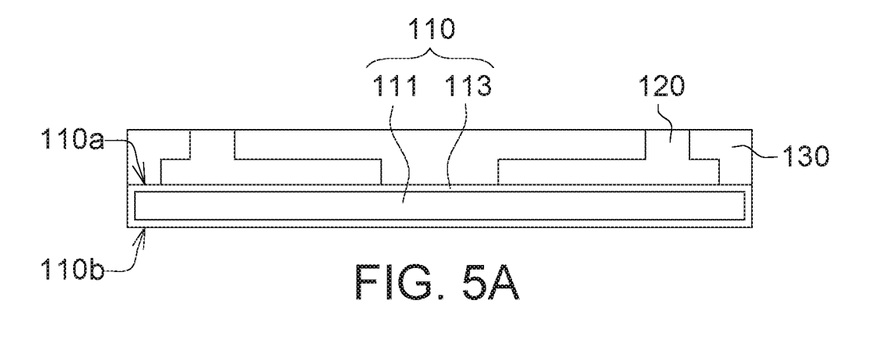
FIG. 5A~FIG. 5D illustrate a process for removing a carrier according to an embodiment of the present invention.
Figure 5B:
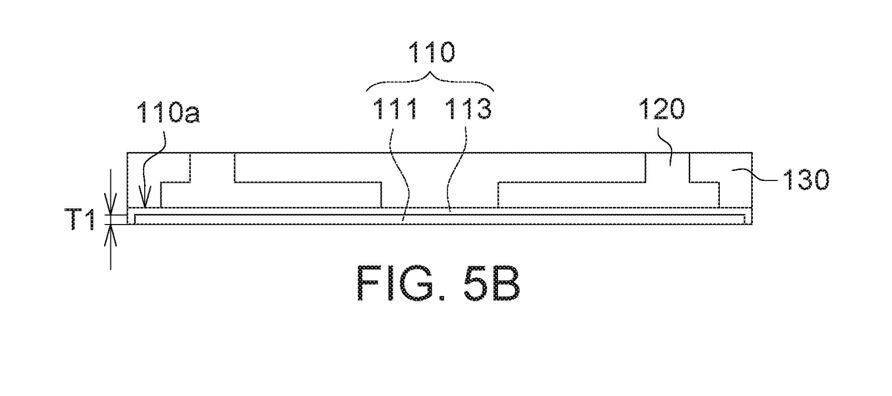

Referring to FIG. 5A, a trace wiring layer 120 and a dielectric layer 130 are disposed on the first surface 110a of the carrier 110. The trace wiring layer 120 is embedded within the dielectric layer 130. Referring to FIG. 5B, the carrier 110 is etched with a first chemical solution to remove a part of the exterior clad layer 113 on the second surface 110b of the carrier 110 and a part of the inner core layer 111.

In the embodiment, the first chemical solution comprises such as iron chloride or hydrogen chloride.

In the embodiment, the etch rate of the first chemical solution with respect to the inner core layer 111 is greater than 20 μm/min, and the thickness T1 of the remaining part of the inner core layer 111 is about 20 μm.

Figure 5C:
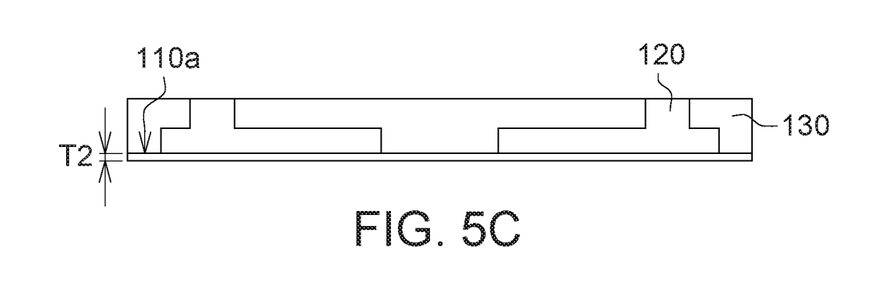

Referring to FIG. 5C, the carrier 110 is etched with a second chemical solution to remove the remaining inner core layer 111 of the carrier 110 and expose part of the exterior clad layer 113 on the first surface 110a of the carrier 110.

In the embodiment, a ratio of the etch rate of the second chemical solution with respect to the inner core layer 111 to the etch rate of the second chemical solution with respect to the exterior clad layer 113 is about greater than 5. In the embodiment, the second chemical solution comprises such as sulfuric acid or hydrogen peroxide.

In the embodiment, the etch rate of the second chemical solution with respect to the exterior clad layer 113 is about less than 1 μm/min, the etch rate of the second chemical solution with respect to the inner core layer 111 is about greater than 5 μm/min, and the thickness T2 of the remaining part of the exterior clad layer 113 is about 3 μm. As a result, the inner core layer 111 is substantially etched and totally removed. With the difference of the etch rates of the second chemical solution with respect to the inner core layer 111 and with respect to the exterior clad layer 113, the level of the exterior clad layer 113 being etched by the second chemical solution can be reduced, the remaining part of the exterior clad layer 113 may have a relatively flat surface, and the damage to the trace wiring layer caused by excess etching can be prevented.

Figure 5D:
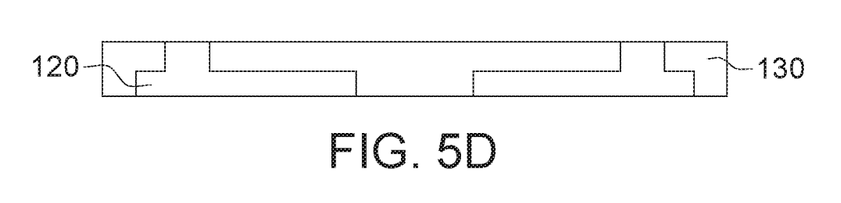

Referring to FIG. 5D, via the flat surface of the exterior clad layer 113 obtained in the second etching step, the carrier 110 is etched with a third chemical solution to remove the remaining part of the exterior clad layer 113 on the first surface 110a of the carrier 110 and expose the trace wiring layer 120.

In the embodiment, the third chemical solution comprises such as ammonium chloride or ammonia. In the embodiment, an etch rate of the third chemical solution with respect to the exterior clad layer 113 is about less than 5 μm/min. After being etched, the exposed trace wiring layer 120 has a relative flat surface.

In another embodiment, when the carrier 110 is etched by the third chemical solution, the trace wiring layer 120 is also etched by about 3~5 μm, such that the surface of the trace wiring layer 120 is below the first surface 130a of the dielectric layer 130.

As described above, the carrier 110 comprising the inner core layer 111 and the exterior clad layer 113 are etched by three separate chemical solutions in three separate etching steps, respectively, to be removed. As such, the compositions and etch rates of each of the chemical solutions can be adjusted individually according to the properties of the different to-be-etched films, such that the control level of the whole etching process can be increased, and after being etched, the surface of the exposed trace wiring layer 120 can be achieved with better evenness.

Figure 6:
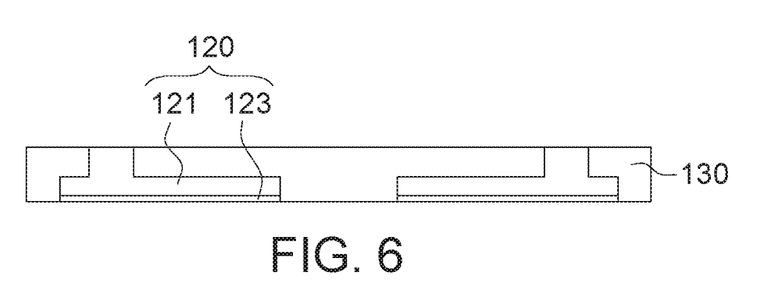
FIG. 6 illustrates a process for removing a carrier according to another embodiment of the present invention.

Please refer to FIGS. 5A~5C and FIG. 6. FIG. 6 illustrates a process for removing a carrier according to another embodiment of the present invention. The elements of this and previous embodiments sharing the same labeling are the same elements, and the description of which are as aforementioned.

First, as shown in FIGS. 5A~5C, the carrier 110 is etched with a first chemical solution to remove part of the exterior clad layer 113 on the second surface 110b of the carrier 110 and part of the inner core layer 111. In addition, the carrier 110 is etched with a second chemical solution to remove the inner core layer 111 and expose part of the exterior clad layer 113 on the first surface 110a of the carrier 110.

Next, referring to FIG. 6, the carrier 110 is etched with a third chemical solution to remove part of the exterior clad layer 113 on the first surface 110a of the carrier 110 and expose the trace wiring layer 120. In the embodiment, the trace wiring layer 120 comprises a conductive layer 121 and a barrier layer 123, the barrier 123 is disposed between the carrier 110 and the conductive layer 121, and the barrier layer 123 is exposed after the etching step with the third chemical solution.

In the embodiment, the etch rate of the second chemical solution with respect to the exterior clad layer 113 is about 5 μm/min, the etch rate of the second chemical solution with respect to the inner core layer 111 is about greater than 20 μm/min, and the remaining part of the exterior clad layer 113 has a thickness of about 3 μm. As a result, the inner core layer 111 is substantially etched and totally removed, and the remaining part of the exterior clad layer 113 has a relative flat surface after being etched. In the embodiment, the etch rate of the third chemical solution with respect to the barrier layer 123 is about less than 1 μm/min, the etch rate of the third chemical solution with respect to the exterior clad layer 113 is about less than 5 μm/min, and the barrier layer 123 has a thickness of about 3 μm after being etched. As a result, with the difference of the etch rates of the third chemical solution with respect to the barrier layer 123 and with respect to the exterior clad layer 113, the possible damage to the trace wiring layer 121 from the second chemical solution can be prevented.

Figure 7:
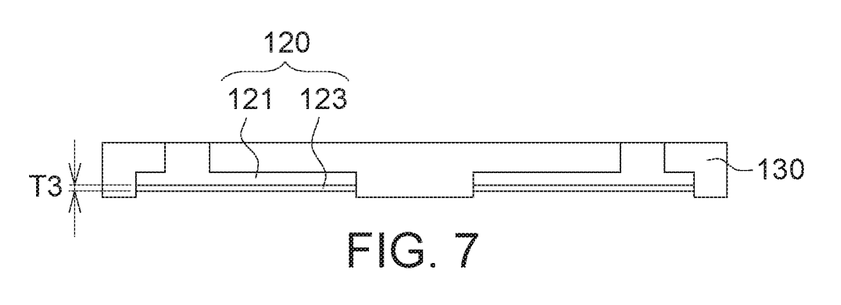
FIG. 7 illustrates a process of removing a carrier according to a further embodiment of the present invention.

Please refer to FIGS. 5A~5C and FIG. 7. FIG. 7 illustrates a process of removing a carrier according to a further embodiment of the present invention. The elements in this and previous embodiments sharing the same labeling are the same elements, and the description of which are as aforementioned.

First, as shown in FIGS. 5A~5C, the carrier 110 is etched with a first chemical solution to remove part of the exterior clad layer 113 on the second surface 110b of the carrier 110 and part of the inner core layer 111. In addition, the carrier 110 is etched with a second chemical solution to remove the inner core layer 111 and expose part of the exterior clad layer 113 on the first surface 110a of the carrier 110.

Next, referring to FIG. 7, the carrier 110 is etched with a third chemical solution to remove part of the exterior clad layer 113 on the first surface 110a of the carrier 110 and expose the trace wiring layer 120. In the embodiment, the trace wiring layer 120 comprises a conductive layer 121, a barrier layer 123, and a protective layer 125. The barrier layer 123 is disposed between the carrier 110 and the conductive layer 121, and the protective layer 125 is disposed between the carrier 110 and the barrier layer 123. As shown in FIG. 7, the material of the protective layer 125 is such as the same with the material of the exterior clad layer 113. When the carrier 110 is etched by the third chemical solution, the protective layer 125 is also etched, and the barrier layer 123 is exposed after the etching process with the third chemical solution.

In the embodiment, the etch rate of the third chemical solution with respect to the exterior clad layer 113 is about less than 5 μm/min, the etch rate of the third chemical solution with respect to the barrier layer 123 is about less than 1 μm/min, and the barrier layer 123 has a thickness of about 3 μm after being etched.

In the embodiment, the protective layer 125 is substantially etched and totally removed after being etched, and the exposed barrier layer 123 has a relative flat surface, such that the surface of the trace wiring layer 120 is below the first surface 130a of the dielectric layer 130.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure for preventing damage to a trace wiring layer of a semiconductor package device during manufacturing, comprising:
a carrier, being used as a support during the manufacturing of the semiconductor package device, comprising an inner core layer and an exterior clad layer, wherein the exterior clad layer covers the inner core layer to form a first carrier surface and a second carrier surface opposite to the first carrier surface;
wherein during the manufacturing, the semiconductor package device includes a dielectric layer and a trace wiring layer, the dielectric layer having a first dielectric surface adjacent to the first carrier surface and a second dielectric surface opposite the first dielectric surface, and the trace wiring layer is embedded between the first and second dielectric surface and electrically connecting the first carrier surface to the second dielectric surface;
wherein the inner core layer and the exterior clad layer are of different materials such that the exterior clad layer has a lower etch rate than the inner core layer.

2. The semiconductor structure according to claim 1, wherein the inner core layer comprises a first metal and the exterior clad layer comprises a second metal.

3. The semiconductor structure according to claim 2, wherein the first metal comprises iron (Fe) and the second metal comprises copper (Cu).

4. The semiconductor structure according to claim 3, wherein the first metal is an alloy and further comprises carbon (C), manganese (Mg), phosphorus (P), sulfur (S), chromium (Cr) or nickel (Ni).

5. The semiconductor structure according to claim 4, wherein the first metal is a steel alloy.

6. The semiconductor structure according to claim 1, wherein the ratio of the thickness of the inner core layer to the thickness of the exterior clad layer on the first carrier surface is greater than 10.

7. The semiconductor structure according to claim 1, wherein the dielectric layer comprises a resin material and silica fillers.

8. The semiconductor structure according to claim 1, wherein the trace wiring layer comprises a conductive layer adjacent to and in contact with the exterior clad layer on the first dielectric surface.

9. The semiconductor structure according to claim 8, wherein the conductive layer further comprises a barrier layer disposed between the first carrier surface and the conductive layer and adjacent to the exterior clad layer on the first carrier surface, the barrier layer having a smaller etch rate than the exterior clad layer on the first carrier surface.

10. The semiconductor structure according to claim 9, wherein the conductive layer further comprises a protective layer disposed between the first carrier surface and the barrier layer and adjacent to the exterior clad layer on the first carrier surface, the protective layer having the same etch rate with the exterior clad layer on the first carrier surface.

* * * * *